(12) United States Patent
Alvarez Fontecilla et al.

(10) Patent No.: US 12,438,549 B2
(45) Date of Patent: Oct. 7, 2025

(54) APPARATUSES AND METHODS FOR EFFICIENT SHUFFLING IN A DIGITAL TO ANALOG CONVERTER

(71) Applicant: Analog Devices, Inc., Wilmington, MA (US)

(72) Inventors: Enrique Alvarez Fontecilla, Encinitas, CA (US); Paul Wilkins, Weston, MA (US)

(73) Assignee: Analog Devices, Inc., Wilmington, MA (US)

( * ) Notice: Subject to any disclaimer, the term of this patent is extended or adjusted under 35 U.S.C. 154(b) by 87 days.

(21) Appl. No.: 18/102,504

(22) Filed: Jan. 27, 2023

(65) Prior Publication Data
US 2024/0259028 A1 Aug. 1, 2024

(51) Int. Cl.
*H03M 1/06* (2006.01)
*H03M 1/08* (2006.01)

(52) U.S. Cl.
CPC ..................... *H03M 1/08* (2013.01)

(58) Field of Classification Search
CPC ....................................... H03M 1/08
USPC ................... 341/118, 120, 143, 155
See application file for complete search history.

(56) References Cited

U.S. PATENT DOCUMENTS

| | | |
|---|---|---|
| 5,138,317 A | 8/1992 | Story |
| 5,404,142 A | 4/1995 | Adams et al. |
| 6,583,742 B1 * | 6/2003 | Hossack ............... H03M 3/502 341/143 |
| 6,762,702 B2 * | 7/2004 | Kwan .................. H03M 1/0665 341/118 |
| 6,864,819 B2 * | 3/2005 | Wang .................... H03M 1/066 341/143 |
| 9,742,421 B2 | 8/2017 | Zhu |
| 2002/0063647 A1 * | 5/2002 | Brooks ................ H03M 1/067 341/118 |

FOREIGN PATENT DOCUMENTS

| | | |
|---|---|---|
| WO | WO-2010149182 A1 | 12/2010 |
| WO | WO-2024158691 A1 | 8/2024 |

OTHER PUBLICATIONS

"International Application Serial No. PCT/US2024/012402, International Search Report mailed Jun. 5, 2024", 4 pgs.
"International Application Serial No. PCT/US2024/012402, Written Opinion mailed Jun. 5, 2024", 9 pgs.

(Continued)

*Primary Examiner* — Peguy Jean Pierre
(74) *Attorney, Agent, or Firm* — Schwegman Lundberg & Woessner, P.A.

(57) ABSTRACT

Aspects of the present disclosure include receiving a digital input signal having an identified value, determining a number of a plurality of converters, determining, based on the identified value and the number, a minimum number of one or more minimum output configurations, parsing the digital input into a plurality of individual bits, and transmitting the plurality of individual bits to the plurality of converters based on an output configuration of the one or more minimum output configurations.

18 Claims, 15 Drawing Sheets

(56) References Cited

OTHER PUBLICATIONS

Chan, Kok Lim, et al., "Segmented Dynamic Element Matching for High-Resolution Digital-to-Analog Conversion", IEEE Transactions on Circuits and Systems I: Regular Papers, IEEE, US, vol. 55, No. 11, (Dec. 1, 2008), 3383-3392.
Nizam, Mohyar Shaiful, et al., "SFDR Improvement Algorithms for Current-Steering DACs", Key Engineering Materials, vol. 643, (May 11, 2015), 101-108.
Alvarez-Fontecilla, E, et al., "Understanding High-Resolution Dynamic Element Matching DACs", IEEE Circuits Syst. Magazine, (2023).
Baird, Rex, et al., "Linearity Enhancement of Multi-bit ?S A/D and D/A Converters Using Data Weighted Averaging", IEEE Trans. Circuits Syst. II: Analog Digit. Signal Process., vol. 42, No. 12, (Dec. 1995), 753-762.
Chen, Tao, et al., "A 14-bit 200-MHz Current-Steering DAC With Switching-Sequence Post-Adjustment Calibration", IEEE Journal of Solid-State Circuits, vol. 42, No. 11, (Nov. 2007), 2386-2394.
Galton, Ian, "Why Dynamic-Element-Matching DACs Work", IEEE Transactions on Circuits and Systems-II: Express Briefs, vol. 57, No. 2, (Feb. 2010), 69-74.
Huang, Hy, et al., "A 10-GS/s NRZ/Mixing DAC with Switching-Glitch Compensation Achieving SFDR >64/50 dBc Over the First/Second Nyquist Zone", IEEE J. Solid-State Circuits, vol. 56, No. 10, (Oct. 2021), 3145-3156.
Kong, D, et al., "A 600 MS/s DAC with Over 87- dB SFDR and 77-dB Peak SNDR Enabled by Adaptive Cancellation of Static and Dynamic Mis-match Error", IEEE J. Solid-State Circuits, vol. 54, No. 8, (Aug. 2019), 2219-2229.
Kong, D, et al., "Adaptive Cancellation of Static and Dynamic Mismatch Error in Continuous-Time DACs", IEEE Trans. Circuits Syst. I, Reg. Papers, vol. 65, No. 2, (Feb. 2018), 421-433.
Lee, Dh, et al., "Low-Cost 14-Bit Current-Steering DAC With a Randomized Thermometer- Coding Method", IEEE Trans. Circuits Syst. II, Exp. Briefs, vol. 56, No. 2, (Feb. 2009), 137-141.
Lin, Ch, et al., "A 16b 6GS/S Nyquist DAC with IMD < -90 dBc up to 1.9 GHZ in 16 nm Cmos", IEEE Int. Solid-State Circuits Conf. (ISSCC) Dig. Tech. Papers, (Feb. 2018), 360-362.
Lin, Wt, et al., "A 12-bit 40 nm DAC Achieving SFDR > 70 dB at 1.6 GS/s and IMD < -61dB at 2.8 GS/s with DEMDRZ Technique", IEEE J. Solid-State Circuits, vol. 49, No. 3, (Mar. 2014), 708-717.
Liu, Jianan, et al., "A 14-Bit 1.0-GS/s Dynamic Element Matching DAC with >80 dB SFDR up to the Nyquist", IEEE Int. Symp. Circuits Syst. (ISCAS), (2015), 1026-1029.
Mao, Wei, et al., "High Dynamic Performance Current-Steering DAC Design With Nested-Segment Structure", IEEE Transactions on Very Large Scale Integration (VLSI) Systems, (2018), 5 pgs.
Mohyar, Shaiful Nizam, et al., "Digital Calibration Algorithm for Half-Unary Current-Steering DAC for Linearity Improvement", Int. SoC Design Conf. (ISOCC), Jeju, South Korea, IEEE, (2014), 60-61.
Rakuljic, Nevena, et al., "Tree-Structured DEM DACs with Arbitrary Nos. of Levels", IEEE Transactions on Circuits and Systems-I: Regular Papers, vol. 57, No. 2, (Feb. 2010), 313-322.
Remple, J, et al., "The Effects of Inter-Symbol Interference in Dynamic Element Matching DACs", IEEE Trans. Circuit Syst. I: Reg. Papers, vol. 64, No. 1, (Jan. 2017), 14-23.
Schofield, W, et al., "A 16b 400MS/s DAC with < -80dBc IMD to 300MHz and < -160dBm/Hz noise power spectral density", IEEE Int. Solid-State Circuits Conf. (ISSCC) Dig. Tech. Papers, (Feb. 2003), 126-482.
J.USA: Wiley, (2005), 455 pgs Schreier, Richard, et al., "Understanding Delta-Sigma Data Converters", Hoboken, NJ,.
Tseng, Wh, et al., "17.3 A 14b 16GS/s Time-Interleaving Direct-RF Synthesis DAC with T-Dem Achieving -70dBc IM3 up to 7.8GHz in 7nm", IEEE Int. Solid-State Circuits Conf. (ISSCC) Dig. Tech. Papers, (2023), 268-270.
Zhu, H, et al., "A Two-Parameter Calibration Technique Tracking Temperature Variationsfor Current Source Mismatch", IEEE Trans. Circuits Syst. II: Exp. Briefs, vol. 64, No. 4, (Apr. 2017), 387-391.

* cited by examiner

600

| | $n$ | $n+1$ | $n+2$ | $n+3$ | $n+4$ | $n+5$ | $n+6$ | $n+7$ |
|---|---|---|---|---|---|---|---|---|
| $c_8[n]$ | 0 | 0 | 0 | 1 | 0 | 0 | 0 | 0 |
| $c_7[n]$ | 0 | 0 | 0 | 1 | 0 | 0 | 0 | 0 |
| $c_6[n]$ | 0 | 0 | 0 | 1 | 0 | 0 | 0 | 0 |
| $c_5[n]$ | 0 | 0 | 0 | 1 | 0 | 0 | 0 | 0 |
| $c_4[n]$ | 0 | 0 | 0 | 1 | 0 | 0 | 0 | 0 |
| $c_3[n]$ | 0 | 0 | 0 | 1 | 0 | 0 | 0 | 0 |
| $c_2[n]$ | 0 | 0 | 0 | 1 | 0 | 0 | 0 | 0 |
| $c_1[n]$ | 0 | 0 | 0 | 1 | 0 | 0 | 0 | 0 |

610

| | $n$ | $n+1$ | $n+2$ | $n+3$ | $n+4$ | $n+5$ | $n+6$ | $n+7$ |
|---|---|---|---|---|---|---|---|---|
| $c_8[n]$ | 1 | 0 | 0 | 0 | 0 | 0 | 0 | 0 |
| $c_7[n]$ | 0 | 1 | 0 | 0 | 0 | 0 | 0 | 0 |
| $c_6[n]$ | 0 | 0 | 1 | 0 | 0 | 0 | 0 | 0 |
| $c_5[n]$ | 0 | 0 | 0 | 1 | 0 | 0 | 0 | 0 |
| $c_4[n]$ | 0 | 0 | 0 | 0 | 1 | 0 | 0 | 0 |
| $c_3[n]$ | 0 | 0 | 0 | 0 | 0 | 1 | 0 | 0 |
| $c_2[n]$ | 0 | 0 | 0 | 0 | 0 | 0 | 1 | 0 |
| $c_1[n]$ | 0 | 0 | 0 | 0 | 0 | 0 | 0 | 1 |

|   | $n$ | $n+1$ | $n+2$ | $n+3$ |
|---|---|---|---|---|
| $c_8[n]$ | 0 | 0 | 1 | 0 |
| $c_7[n]$ | 0 | 0 | 1 | 0 |
| $c_6[n]$ | 0 | 0 | 1 | 0 |
| $c_5[n]$ | 0 | 0 | 1 | 0 |
| $c_4[n]$ | 0 | 0 | 1 | 0 |
| $c_3[n]$ | 0 | 0 | 1 | 0 |
| $c_2[n]$ | 0 | 0 | 1 | 0 |
| $c_1[n]$ | 0 | 0 | 1 | 0 |

710:

|   | $n$ | $n+1$ | $n+2$ | $n+3$ |
|---|---|---|---|---|
| $c_8[n]$ | 1 | 0 | 0 | 0 |
| $c_7[n]$ | 1 | 0 | 0 | 0 |
| $c_6[n]$ | 0 | 1 | 0 | 0 |
| $c_5[n]$ | 0 | 1 | 0 | 0 |
| $c_4[n]$ | 0 | 0 | 1 | 0 |
| $c_3[n]$ | 0 | 0 | 1 | 0 |
| $c_2[n]$ | 0 | 0 | 0 | 1 |
| $c_1[n]$ | 0 | 0 | 0 | 1 |

720:

|   | $n$ | $n+1$ | $n+2$ | $n+3$ |
|---|---|---|---|---|
| $c_8[n]$ | 1 | 0 | 0 | 0 |
| $c_7[n]$ | 0 | 1 | 0 | 0 |
| $c_6[n]$ | 1 | 0 | 0 | 0 |
| $c_5[n]$ | 0 | 1 | 0 | 0 |
| $c_4[n]$ | 0 | 0 | 1 | 0 |
| $c_3[n]$ | 0 | 0 | 0 | 1 |
| $c_2[n]$ | 0 | 0 | 1 | 0 |
| $c_1[n]$ | 0 | 0 | 0 | 1 |

730:

|   | $n$ | $n+1$ | $n+2$ | $n+3$ |
|---|---|---|---|---|
| $c_8[n]$ | 1 | 0 | 0 | 0 |
| $c_7[n]$ | 0 | 1 | 0 | 0 |
| $c_6[n]$ | 0 | 0 | 1 | 0 |
| $c_5[n]$ | 0 | 0 | 0 | 1 |
| $c_4[n]$ | 0 | 0 | 0 | 1 |
| $c_3[n]$ | 0 | 0 | 1 | 0 |
| $c_2[n]$ | 0 | 1 | 0 | 0 |
| $c_1[n]$ | 1 | 0 | 0 | 0 |

*FIG. 7*

| | $n$ | $n+1$ | $n+2$ | $n+3$ | $n+4$ | $n+5$ | $n+6$ | $n+7$ |
|---|---|---|---|---|---|---|---|---|
| $c_8[n]$ | 0 | 0 | 0 | 1 | 1 | 0 | 1 | 0 |
| $c_7[n]$ | 0 | 0 | 0 | 1 | 1 | 0 | 1 | 0 |
| $c_6[n]$ | 0 | 0 | 0 | 1 | 1 | 0 | 1 | 0 |
| $c_5[n]$ | 0 | 0 | 0 | 1 | 1 | 0 | 1 | 0 |
| $c_4[n]$ | 0 | 0 | 0 | 1 | 1 | 0 | 1 | 0 |
| $c_3[n]$ | 0 | 0 | 0 | 1 | 1 | 0 | 1 | 0 |
| $c_2[n]$ | 0 | 0 | 0 | 1 | 1 | 0 | 1 | 0 |
| $c_1[n]$ | 0 | 0 | 0 | 1 | 1 | 0 | 1 | 0 |

800

| | $n$ | $n+1$ | $n+2$ | $n+3$ | $n+4$ | $n+5$ | $n+6$ | $n+7$ |
|---|---|---|---|---|---|---|---|---|
| $c_8[n]$ | 1 | 0 | 0 | 0 | 0 | 0 | 1 | 1 |
| $c_7[n]$ | 1 | 1 | 0 | 0 | 0 | 0 | 0 | 1 |
| $c_6[n]$ | 1 | 1 | 1 | 0 | 0 | 0 | 0 | 0 |
| $c_5[n]$ | 0 | 1 | 1 | 1 | 0 | 0 | 0 | 0 |
| $c_4[n]$ | 0 | 0 | 1 | 1 | 1 | 0 | 0 | 0 |
| $c_3[n]$ | 0 | 0 | 0 | 1 | 1 | 1 | 0 | 0 |
| $c_2[n]$ | 0 | 0 | 0 | 0 | 1 | 1 | 1 | 0 |
| $c_1[n]$ | 0 | 0 | 0 | 0 | 0 | 1 | 1 | 1 |

| | $n$ | $n+1$ | $n+2$ | $n+3$ | $n+4$ | $n+5$ | $n+6$ | $n+7$ |
|---|---|---|---|---|---|---|---|---|
| $c_8[n]$ | 1 | 0 | 0 | 0 | 1 | 0 | 1 | 0 |
| $c_7[n]$ | 0 | 1 | 0 | 0 | 0 | 1 | 0 | 1 |
| $c_6[n]$ | 1 | 0 | 1 | 0 | 0 | 0 | 1 | 0 |
| $c_5[n]$ | 0 | 1 | 1 | 1 | 0 | 0 | 0 | 1 |
| $c_4[n]$ | 1 | 0 | 0 | 1 | 1 | 0 | 0 | 0 |
| $c_3[n]$ | 0 | 1 | 1 | 0 | 0 | 1 | 1 | 0 |
| $c_2[n]$ | 0 | 0 | 0 | 1 | 1 | 0 | 1 | 0 |
| $c_1[n]$ | 0 | 0 | 0 | 1 | 0 | 1 | 0 | 1 |

| $x[n]$ | $p_{ON}$ | $p_{OFF}$ | Num. 1-bit DACs ON $\frac{x[n]}{\Delta}+\frac{1}{2}L$ | Num. output configurations $\binom{L}{\frac{x[n]}{\Delta}+\frac{1}{2}L}$ | Min. num. output configurations needed for linearity, $N_{min}$ |
|---|---|---|---|---|---|
| $-4\Delta$ | 0 | 1 | 0 | 1 | 1 |
| $-3\Delta$ | 1/8 | 7/8 | 1 | 8 | 8 |
| $-2\Delta$ | 1/4 | 3/4 | 2 | 28 | 4 |
| $-\Delta$ | 3/8 | 5/8 | 3 | 56 | 8 |
| 0 | 1/2 | 1/2 | 4 | 70 | 2 |
| $\Delta$ | 5/8 | 3/8 | 5 | 56 | 8 |
| $2\Delta$ | 3/4 | 1/4 | 6 | 28 | 4 |
| $3\Delta$ | 7/8 | 1/8 | 7 | 8 | 8 |
| $4\Delta$ | 1 | 0 | 8 | 1 | 1 |

FIG. 9

APPARATUSES AND METHODS FOR EFFICIENT SHUFFLING IN A DIGITAL TO ANALOG CONVERTER

BACKGROUND

Integrated circuits (ICs) built using semiconductor materials have many applications, ranging from communication devices to digital-to-analog converters (DACs) just to name a few. For example, a DAC may be configured to convert a digital signal to an analog signal. One or more of the cost, power consumption, complexity, and/or size of an IC may be proportional to the amount of surface area used to implement the IC. Therefore, it is desirable to reduce the amount of surface area and/or the number of devices.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of the present disclosure include receiving a digital input signal having an identified value, determining a number of a plurality of converters, determining, based on the identified value and the number, a minimum number of one or more minimum output configurations, parsing the digital input into a plurality of individual bits, and transmitting the plurality of individual bits to the plurality of converters based on an output configuration of the one or more minimum output configurations.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which:

FIG. 6 illustrates a first example of minimum output configurations for an example 9-level DAC according to some aspects of the present disclosure.

FIG. 7 illustrates a second example of minimum output configurations for an example 9-level DAC according to some aspects of the present disclosure.

FIGS. 8A and 8B illustrate a third example of minimum output configurations for an example 9-level DAC according to some aspects of the present disclosure.

FIG. 9 illustrates an example of a table showing minimum output configurations for an example 9-level DAC according to some aspects of the present disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

An aspect of the present disclosure includes methods for shuffled non-segmented digital-to-analog converters (DACs) that support a number of levels L+1. The DACs may comprise a shuffling encoder, also referred to as dynamic-element matching (DEM) encoder, followed by L nominally-identical 1-bit DACs. The shuffling encoder may rely on the usage of random bits to perform its operation. In one aspect of the present disclosure, the method may allow for the synthesis of linear non-segmented DACs that use the minimum number of random bits. The method may allow for the synthesis of linear non-segmented DACs that use the minimum number of output configurations. In some aspects, the method may dictate how the shuffling encoder may drive the 1-bit DACs to achieve linearity when exercising the minimum number of output configurations for a given DAC input value. If the DAC input is such that k out of L 1-bit DACs are driven with a 1 (i.e., the voltage corresponding to a Boolean 1), then $N_{min}(k)$ output conditions may be exercised, where $N_{min}(k)$ may be given by 1/k times the least common multiplier between k and L. In some aspects, the used subset of $N_{min}(k)$ output configurations may satisfy the following conditions: 1) k 1-bit DACs are driven with a 1 at all sampling times, and 2) each 1-bit DAC may be driven with a 1 with k/L probability.

In some instances, aspects of the present disclosure may enable lower power consumption and/or area. Specifically, aspects of the present disclosure may allow for the usage of the minimum number of random bits for the DAC's shuffler. This may lead to smaller/fewer LFSRs (i.e., linear feedback shift registers). Other aspects of the present disclosure may include enabling the selection between different subsets of minimum output configurations for each DAC input value. For a given DAC input value, there may be specific subsets of output configurations that yield better performance than other configurations (e.g., lower noise). Therefore, aspects of the present disclosure may be used as an additional degree of freedom to calibrate a part that yields improved performance.

Figure 1A:
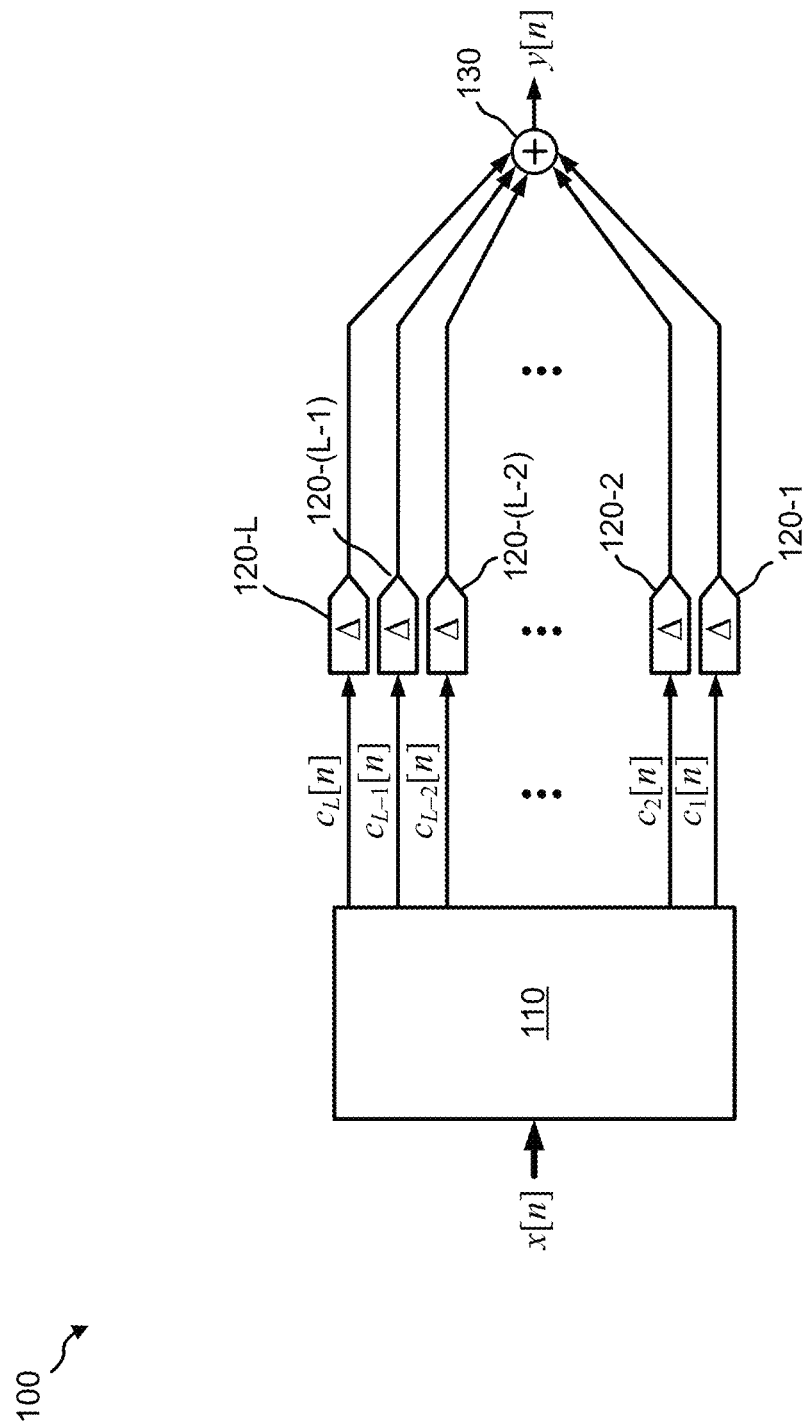
FIG. 1A illustrates an example of a digital-to-analog converter (DAC) circuit according to some aspects of the present disclosure.

FIG. 1A illustrates an example of a DAC circuit 100 according to aspects of the present disclosure. The DAC circuit 100 may include a shuffler 110 configured to shuffle an input x[n] having L+1 different values. The term L may be any positive integer greater than 1. For example, the shuffler 110 may parse the input x[n] into a sequence of individual bits $c_1[n]$, $c_2[n]$ . . . , $c_2[n]$. The order of the individual bits $c_i[n]$, $c_2[n]$, . . . , $c_L[n]$ may be shuffled according to aspects of the present disclosure. The DAC circuit 100 may include a plurality of single-bit-input converters 120-1, 120-2 . . . 120-L configured to convert a bit value to an output value. In one aspect, the plurality of converters 120-1, 120-2 . . . 120-L may convert a bit value of 1 (i.e., logic value 1, such as a "high" voltage) to an output voltage value of $\frac{1}{2}\Delta$, and a bit value of 0 (i.e., logic value 0, such as a "low" voltage) to an output voltage value of $-\frac{1}{2}\Delta$. The set of represented output values by the DAC circuit 100 may include $\{-\frac{1}{2}L\Delta, -\frac{1}{2}(L-2)\Delta \ldots \frac{1}{2}(L-2)\Delta, \frac{1}{2}L\Delta\}$. Other conversions are also possible according to aspects of the present disclosure. Ideally, a value associated with x[n] should be equal to the corresponding value of y[n]. The DAC circuit 100 may include an adder 130 configured to add the output voltage values of the plurality of converters 120-1, 120-2 . . . 120-L to generate an output y[n].

During operation, the DAC circuit 100 may receive the input x[n] having a value. The shuffler 110 may receive the input x[n] and generate bits corresponding to the value of x[n]. The bits may be shuffled by the shuffler 110. The shuffler 110 may output the bits to the plurality of converters 120-1, 120-2 . . . 120-L. Each of the plurality of converters 120-1, 120-2 . . . 120-L may receive the corresponding bit and convert the bit value to an output value (e.g., an output voltage value) as indicated above. The adder 130 may sum the output values from the plurality of converters 120-1, 120-2 . . . 120-L to produce the output y[n].

In some circumstances, mismatches may cause the output y[n] to be a nonlinear function of the input x[n], which introduces distortion into the system. The shuffler 110 may randomly use different nominally-equivalent configurations of the plurality of converters 120-1, 120-2 . . . 120-L for a given input value. As a result, the output y[n] may be a linear function of the input x[n] on average at the expense of additional noise-like errors. The technique is called dynamic-element matching (DEM), or shuffling.

Figure 1B:
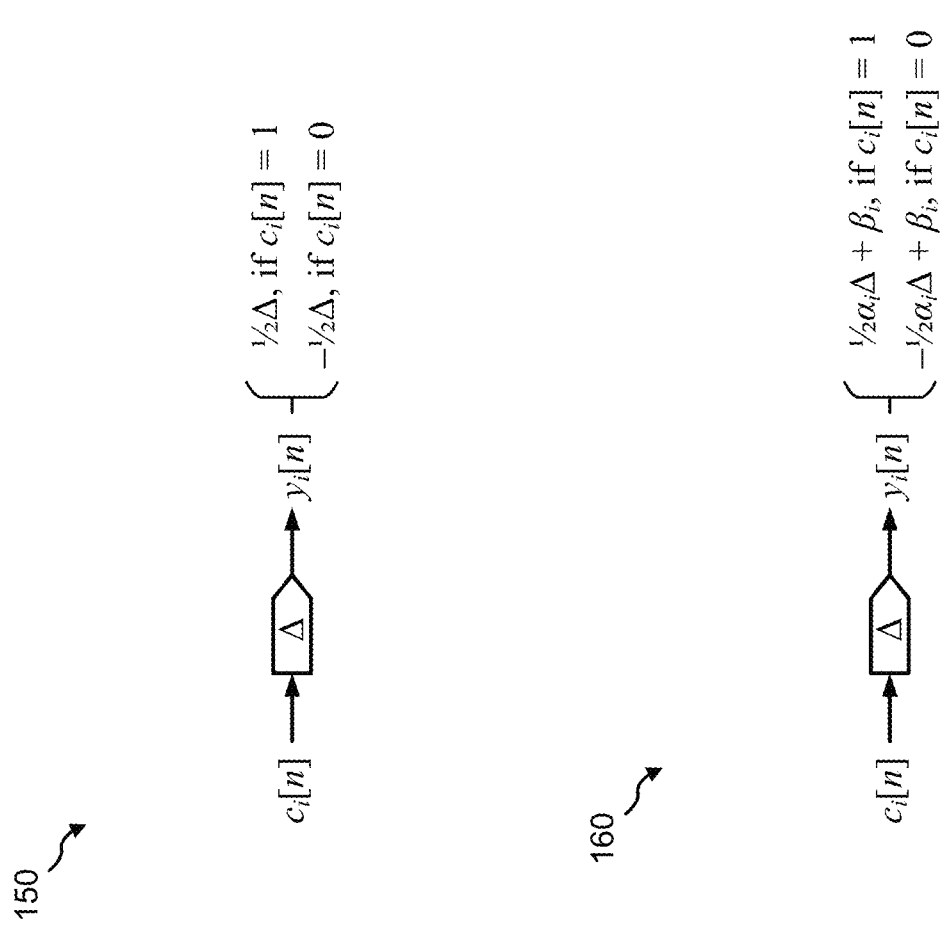
FIG. 1B illustrates examples of the behavior of a single-bit input DAC according to some aspects of the present disclosure.
Figure 2:
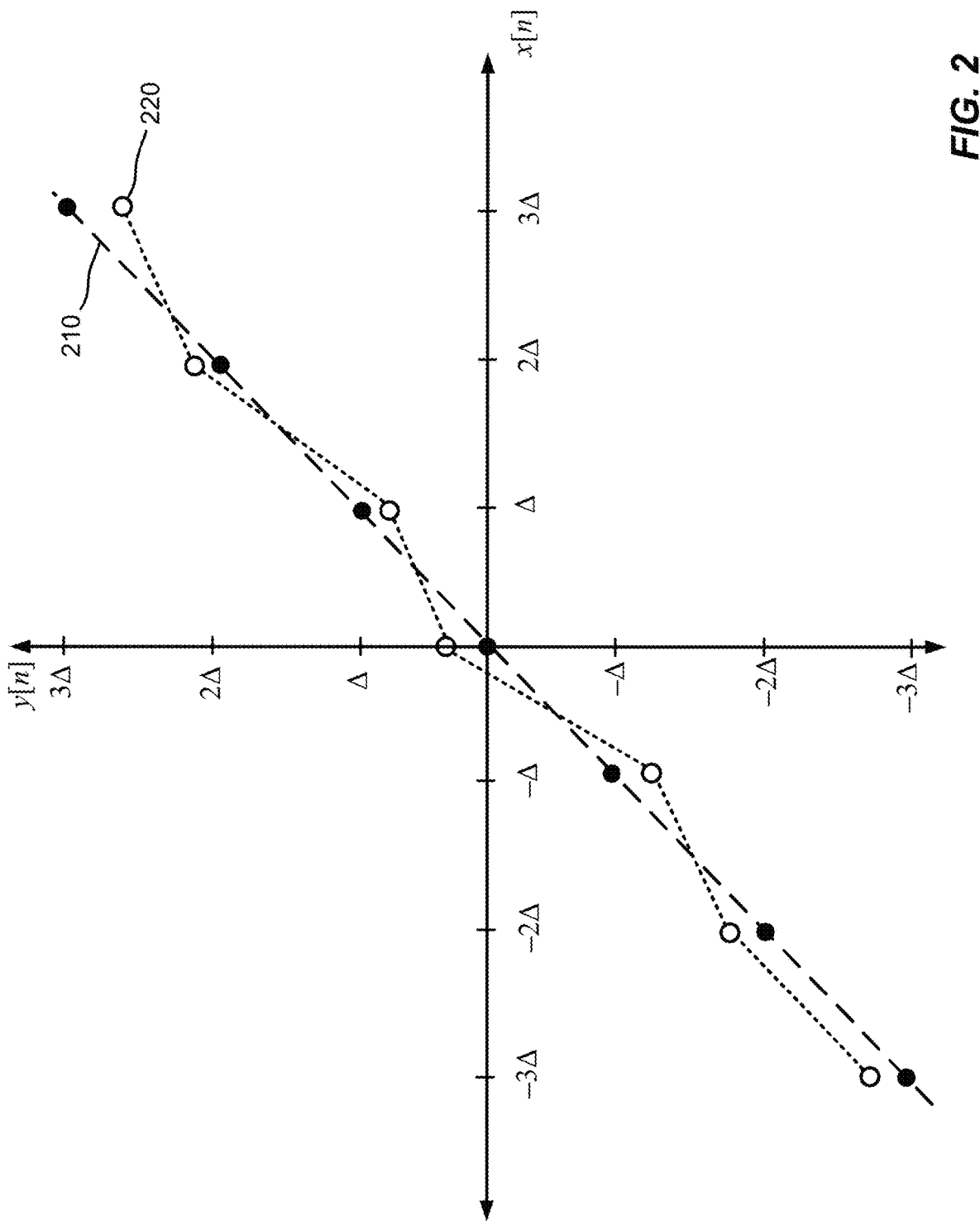
FIG. 2 illustrates an example of output behaviors of the DAC circuit according to some aspects of the present disclosure.

FIG. 1B illustrates examples of single-bit-input DACs. Under the ideal condition, a 1-bit DAC may be modelled as shown in a first model 150. However, in some circumstances, the 1-bit DAC may be modelled as shown in a second model 160. Here, a, is the gain error and $\beta_i$ is the offset error. The gain error may introduce distortion as described below. For example, FIG. 2 illustrates an example of a graph illustrating the output behavior of a DAC circuit. A first line 210 may show an ideal behavior without any errors. A second line 220 may show a non-ideal behavior including one or more of gain errors and/or offset errors.

Figure 3:
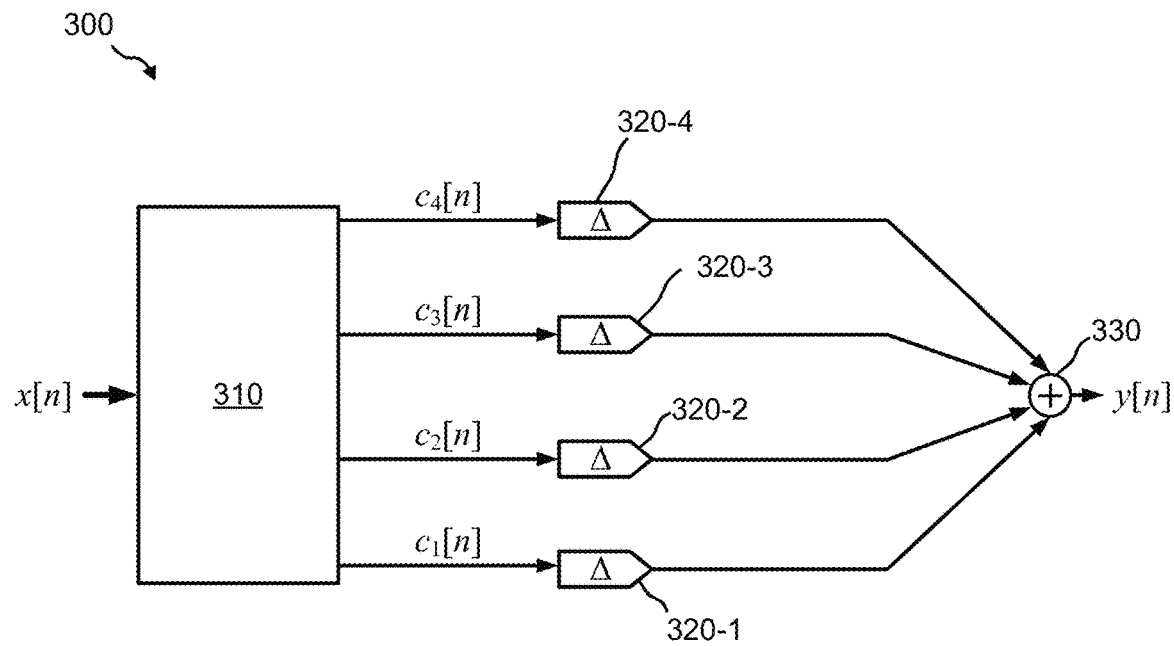
FIG. 3 illustrates an example of a 5-level DAC circuit and an example of output behaviors of the DAC according to some aspects of the present disclosure.
Figure 3:
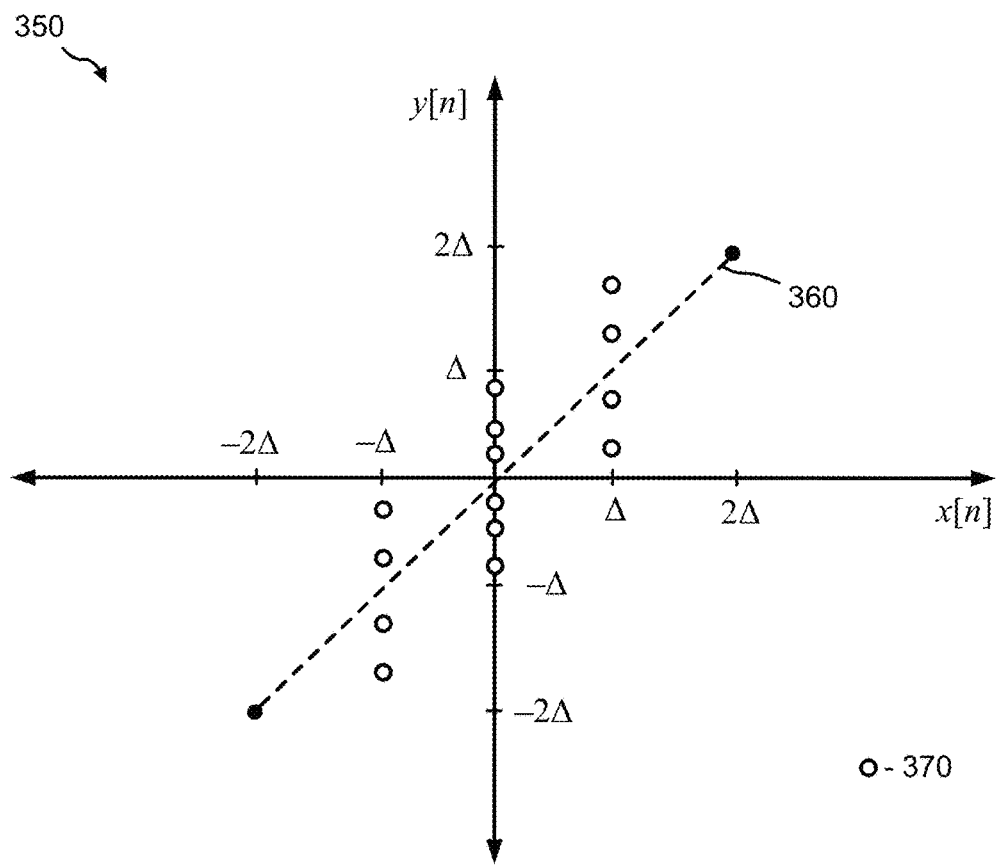

FIG. 3 illustrates an example of a 5-level DAC circuit 300 according to some aspects of the present disclosure. The 5-level DAC circuit 300 may include a shuffler 310 configured to shuffle the bits representing the input x[n]. The 5-level DAC circuit 300 may include a plurality of converters 320-1, 320-2, 320-3, 320-4 configured to convert a bit value to an output value. The 5-level DAC circuit 300 may include an adder 330 configured to sum the output values of the plurality of converters 320-1, 320-2, 320-3, 320-4. Further, FIG. 3 illustrates a diagram 350 showing an ideal output behavior 360 and non-ideal output behaviors 370 of the 5-level DAC circuit 300. The non-ideal output behaviors 370 may originate from the gain errors and/or offset errors associated with the plurality of converters 320-1, 320-2, 320-3, 320-4.

During operation, the 5-level DAC circuit 300 may receive the input x[n] (e.g., bit string "00") corresponding to a value of $-2\Delta$. The shuffler 310 may output four "0" bits to the plurality of converters 320-1, 320-2, 320-3, 320-4. Each of the plurality of converters 320-1, 320-2, 320-3, 320-4 may output a corresponding $-\frac{1}{2}\alpha_i\Delta+\beta_i$. The adder 330 may add the outputs to get a value of $-\frac{1}{2}(\alpha_1+\alpha_2+\alpha_3+\alpha_4)\Delta+(\beta_1+\beta_2+\beta_3+\beta_4)$. There may be one possible output value as shown in the diagram 350.

In some aspects, the 5-level DAC circuit 300 may receive the input x[n] corresponding to a value $\Delta$. The shuffler 310 may output three "1" bits and one "0" bits. However, the shuffler 310 may determine which of the plurality of converters 320-1, 320-2, 320-3, 320-4 to send the "1" bits and which to send the "0" bit. Consequently, there may be four options for the string $[c_1[n], c_2[n], c_3[n], c_4[n]]$: [1, 1, 1, 0], [1, 1, 0, 1], [1, 0, 1, 1], and [0, 1, 1, 1]. As a result, the output y[n] may have one of the following values: $\frac{1}{2}(\alpha_1+\alpha_2+\alpha_3\alpha_4)\Delta+(\beta_1+\beta_2+\beta_3+B_4)$, $\frac{1}{2}(\alpha_1+\alpha_2-\alpha_3+a_4)\Delta+(\beta_1+\beta_2+\beta_3+B_4)$, $\frac{1}{2}(\alpha_1-\alpha_2+\alpha_3+\alpha_4)\Delta+(\beta_1+\beta_2+\beta_3+B_4)$, or $\frac{1}{2}(-\alpha_1+\alpha_2+\alpha_3+\alpha_4)\Delta+(\beta_1+\beta_2+\beta_3+\beta_4)$. The possible output values are shown in the diagram 350.

In one aspect of the present disclosure, the shuffler 310 may shuffle the "0" bits and the "1" bits to maintain linearity on average for a number of output values. For any given input value, it may not be necessary for the shuffler to select among all possible output configurations. Further, it may not be necessary for the shuffler to select the possible configurations with equal probability. By implementing the schemes discussed in the aspect of the current disclosure, the shuffler 310 may be implemented with reduced number of semiconductor components, consume less power, and/or cost less to manufacture.

According to aspects of the present disclosure, linearity, on average, may be achieved by driving all 1-bit DACs together, potentially at the expense of increased error. The minimum number of output configurations that must be exercised to achieve linearity may be derived from such aspect of the present disclosure.

Referring to FIGS. 1 and 2, the entire input range from $x[n]=-\frac{1}{2}L\Delta$ to $x[n]=\frac{1}{2}L\Delta$ may be used. As the extreme values have a single output configuration (i.e., all 1-bit DACs inputs set to "1" or "0"), the equation of the line over which y[n] should fall on average (i.e., $f(\cdot)$) may be determined as follows:

$$x[n] = -\frac{1}{2}L\Delta \rightarrow y[n] = -\left(\frac{1}{L}\sum_{i=1}^{L}\alpha_i\right)L\frac{\Delta}{2} + \sum_{i=1}^{L}\beta_i,$$

$$x[n] = \frac{1}{2}L\Delta \rightarrow y[n] = \left(\frac{1}{L}\sum_{i=1}^{L}\alpha_i\right)L\frac{\Delta}{2} + \sum_{i=1}^{L}\beta_i,$$

$$f(x[n]) = \left(\frac{1}{L}\sum_{i=1}^{L}\alpha_i\right)x[n] + \sum_{i=1}^{L}\beta_i = \hat{\alpha}x[n] + \hat{\beta}.$$

Figure 4:
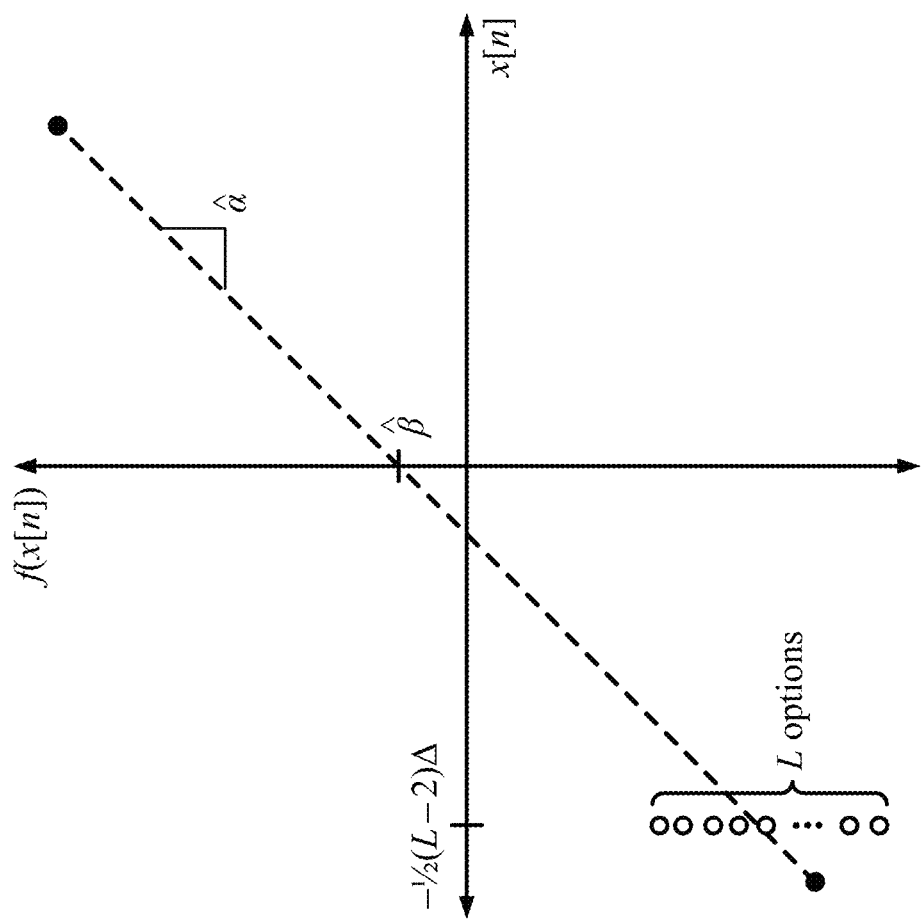
FIG. 4 illustrates an example of output configurations of an (L+1)-level DAC circuit according to some aspects of the present disclosure.

The shuffler 110 may select different output configurations such that y[n] may fall, on average, over f(x[n]), as shown in FIG. 4. For x[n]=−½(L−2)Δ (i.e., the smallest input value after −½LΔ), the shuffler 110 may set the input of a single 1-bit converter to "1", so it has $$\binom{L}{1} = L \text{ options.}$$

Figure 5:
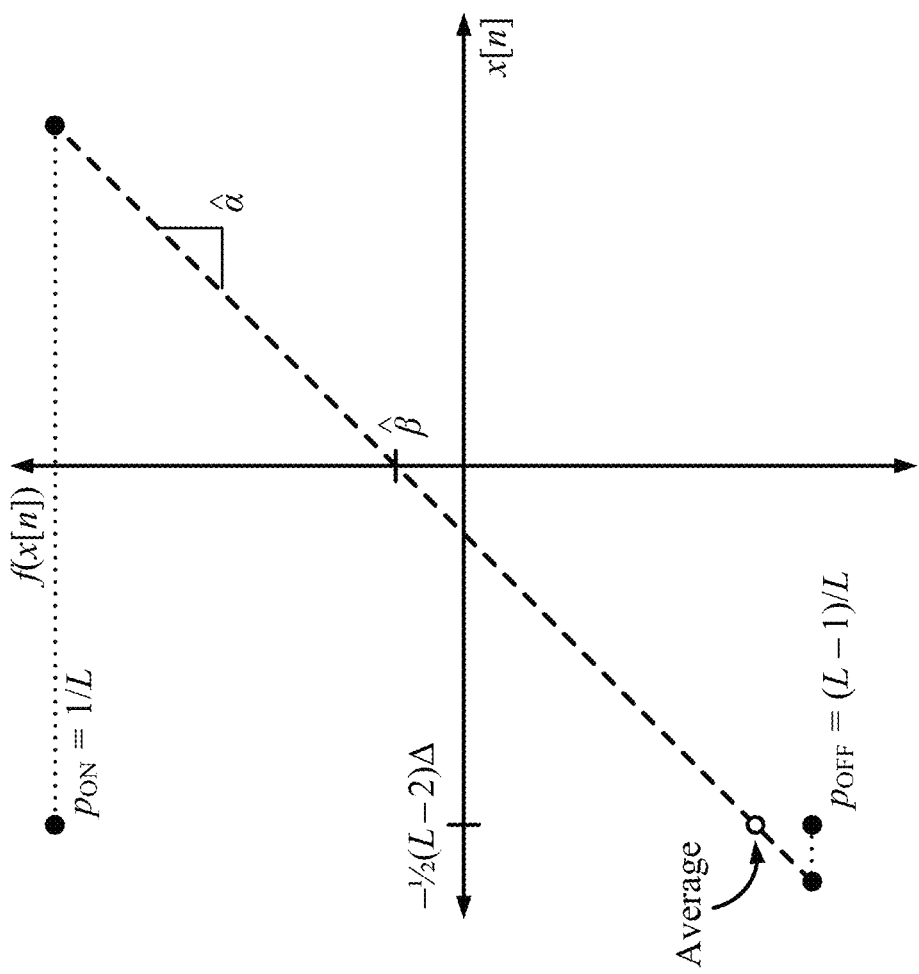
FIG. 5 illustrates an example of output configurations and associated probability according to some aspects of the present disclosure.

Turning to FIG. 5, and also referring to FIG. 1, for x[n]=−½(L−2)Δ, if all the 1-bit DAC inputs are set to "1" ("on") one time, and then to "0" ("off"), L−1 times, then y[n] may fall on f(x[n]) on average. The principle here may be applied to other input values. In one aspect of the present disclosure, the shuffler 110 may be configured such that $c_1[n]=c_2[n]=\ldots=c_L[n]=1$ with probability of $p_{ON}$=(x[n]+½LΔ)/(LΔ) and $c_1[n]=c_2[n]=\ldots=c_L[n]=0$ with probability of $P_{OFF}=1-P_{ON}$. However, the scheme above may cause an unacceptable amount of error at any given sampling time.

In some aspects of the present disclosure, a minimum condition may be used for linearization. In a first example, for L=8 and x[n]=−3Δ for all n ($p_{ON}$=⅛ and $P_{OFF}$=⅞). There may be over eight sample times the 1-bit DAC input values may be shown in a first matrix 600 of FIG. 6. However, the "1" values do not have to be in the same column of the first matrix 600. If $c_i[n]=1$ for each i with probability $p_{ON}$, then y[n] may be a linear function of x[n] on average. Therefore, aspects of the present disclosure may include distributing the "1" values over different sample times as shown in a second matrix 610. This may prevent noise from accumulating at the same sample time.

In a second example, for x[n]=−2Δ for all n ($p_{ON}$=¼ and $P_{OFF}$=¾). There may be over four sample times the 1-bit DAC input values may be shown in a first matrix 700 of FIG. 7. The "1" values and the "0" values may be rearranged as long as $c_i[n]=1$ for each i with probability $p_{ON}$ (e.g., two "1" values per column). Therefore, aspects of the present disclosure may include distributing the "1" values over different sample times as shown in any one of a second matrix 710, a third matrix 720, or a fourth matrix 730. Other combinations of "1" values and "0" values may also be possible. Here, there are $$\binom{8}{2} = 28$$

configurations of "1" and "0", but only a subset of four is sufficient.

In a third example, for x[n]=−Δ for all n ($p_{ON}$=⅜ and $P_{OFF}$=⅝). There may be over eight sample times the 1-bit DAC input values may be shown in a first matrix 800 of FIGS. 8A and 8B. The "1" values and the "0" values may be rearranged as long as $c_i[n]=1$ for each i with probability $p_{ON}$ (e.g., three "1" values per column). Therefore, aspects of the present disclosure may include distributing the "1" values over different sample times as shown in any one of a second matrix 810, or a third matrix 820. Other combinations of "1" values and "0" values may also be possible. Here, there are $$\binom{8}{3} = 56$$

configurations of "1" and "0", but only a subset of eight is sufficient.

Accordingly, for L=8, the minimum number of output configurations per input value necessary for linearity is shown in FIG. 9.

Aspects of the present disclosure include determining minimum conditions necessary for linearity. For x[n]=−½(L−2)Δ, −½(L−4)Δ, ... ½(L−2)Δ, the minimum number of output configurations that may be selected to achieve linearity is:

$$N_{min}(x[n]) = \frac{1}{\frac{x[n]}{\Delta} + \frac{1}{2}L} LCM\left(L, \frac{x[n]}{\Delta} + \frac{1}{2}L\right).$$

Here, LCM stands for the least common multiple. As $N_{min}(x[n]) \leq Z$ for all possible input values, a shuffler may only require $\log_2(L)$ pseudo-random sequences to achieve linearity. It may not be necessary for all output configurations to be selected with the same probability. If only $N_{min}(x[n])$ options are used, then all options may be selected with probability $1/N_{min}(x[n])$. If more than $N_{min}(x[n])$ options are used, then the probabilities may be anything provided $c_i[n]=1$ for each i with the appropriate probability as described above.

Figure 10:
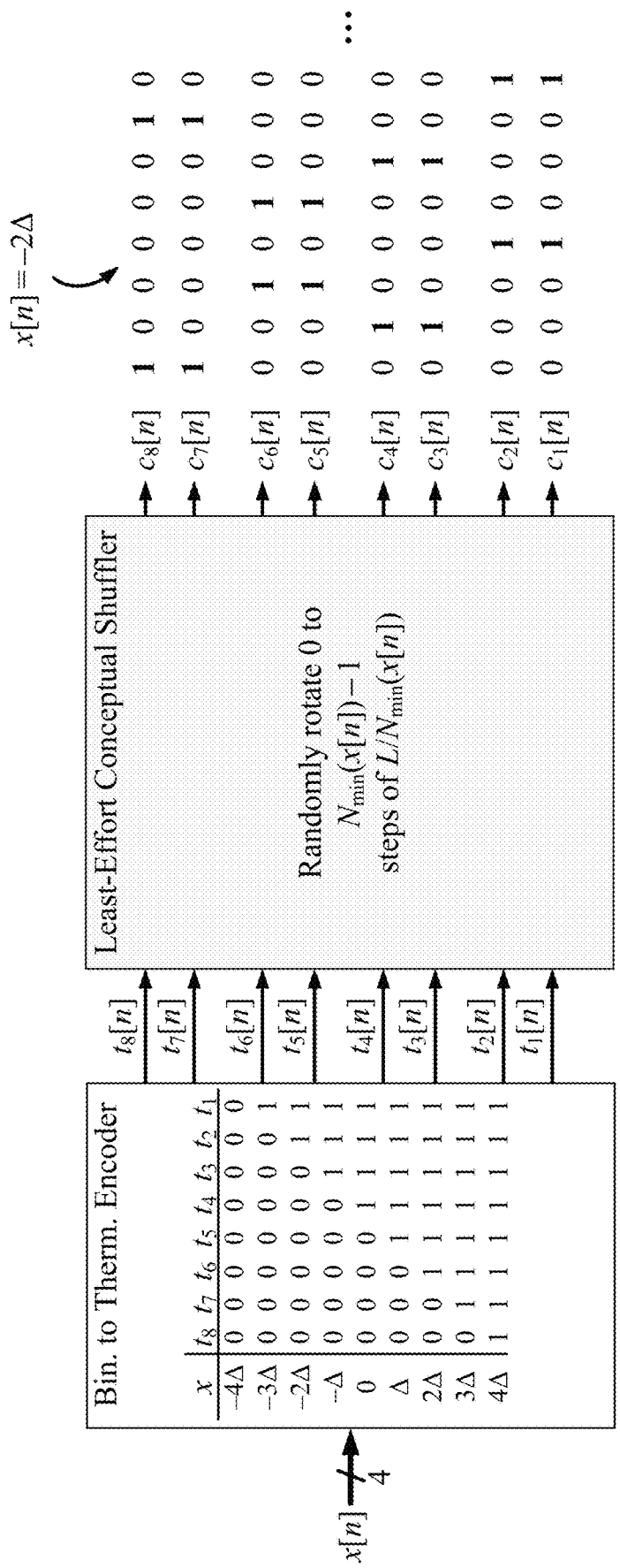
FIG. 10 illustrates a first example of least-effort shuffling according to some aspects of the present disclosure.

FIG. 10 illustrates a first example of an operation of a shuffler according to aspects of the present disclosure. For L=8, the shuffler may require at most $\log_2(L)$=3 random bits. If x[n]=−2Δ (in which case $N_{min}(-2\Delta)=4$), the outputs may look as shown in FIG. 10.

Figure 11A:
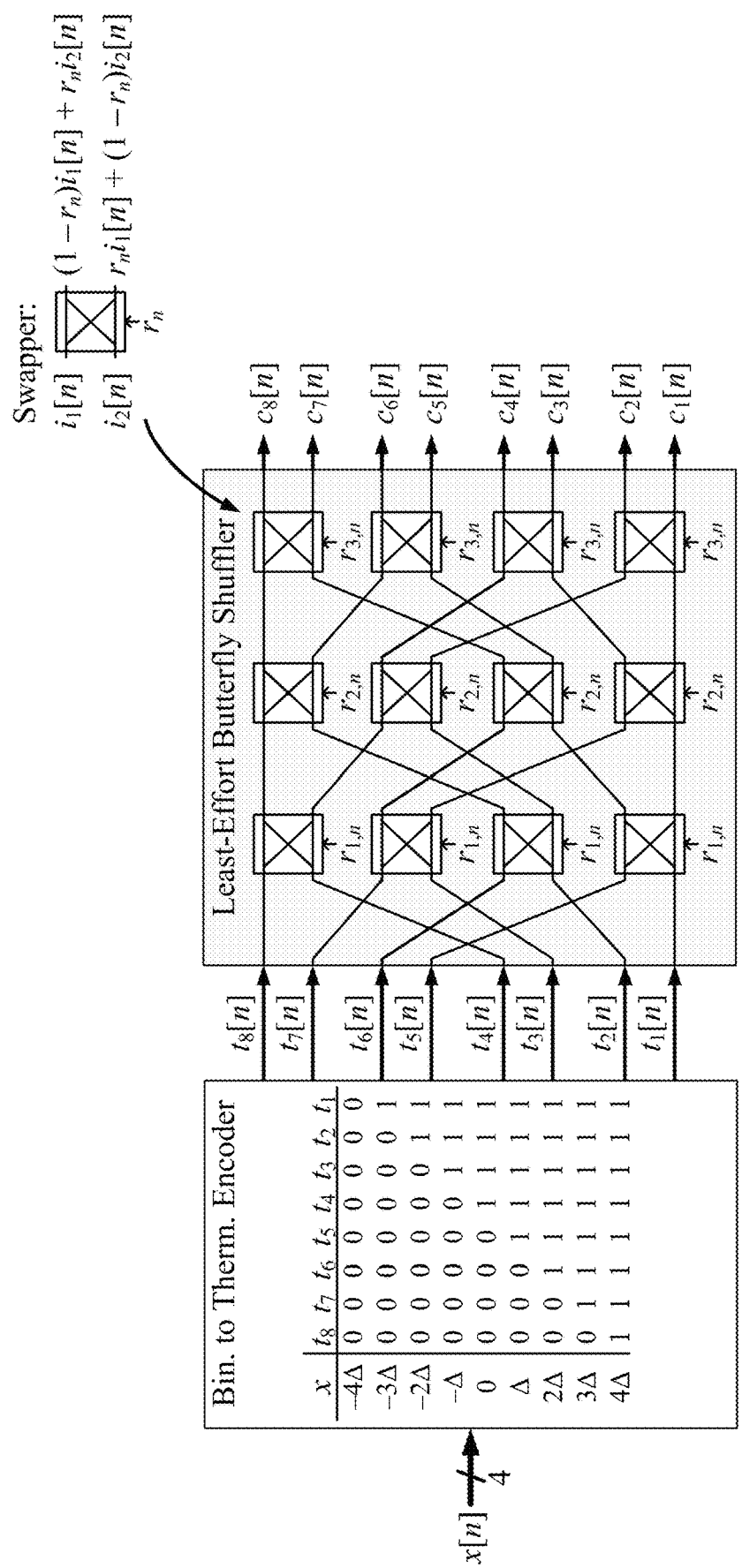
FIGS. 11A and 11B illustrate a second example of least-effort shuffling according to some aspects of the present disclosure.
Figure 11B:
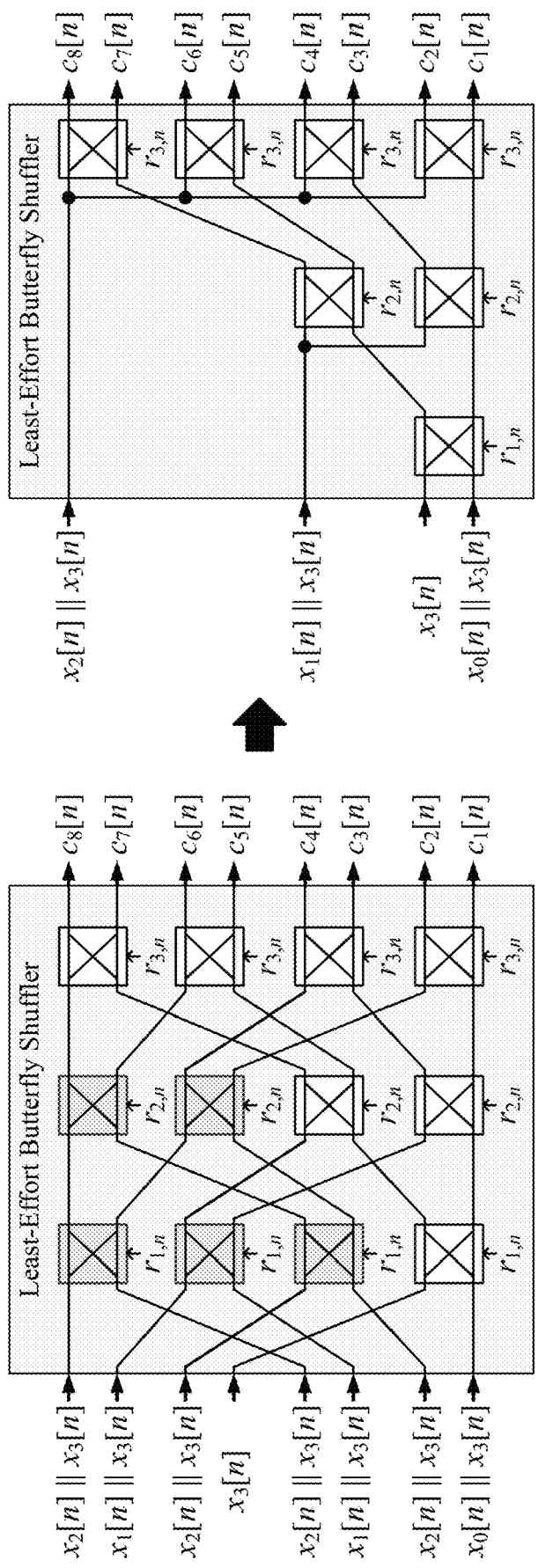

FIGS. 11A and 11B illustrate a second example of an operation of a shuffler according to aspects of the present disclosure. For L=8, the shuffler may use only $\log_2(L)$=3 random bits instead of ½L $\log_2(L)$=12 (where 12 may be the number of random bits required if every swapper of the shuffler has its own random bit). The shuffler may select the minimum number of output configurations per input value. As shown in FIG. 11B, the input of the shuffler may be connected according to aspects of the present disclosure to reduce the number of swappers. The red swappers have identical input values for all values of x[n] and can be eliminated. In some aspects of the present disclosure, the scheme above to simplify the butterfly shuffler may also be implemented to reduce or eliminate the binary-to-thermometer encoder in the shuffler.

Figure 12:
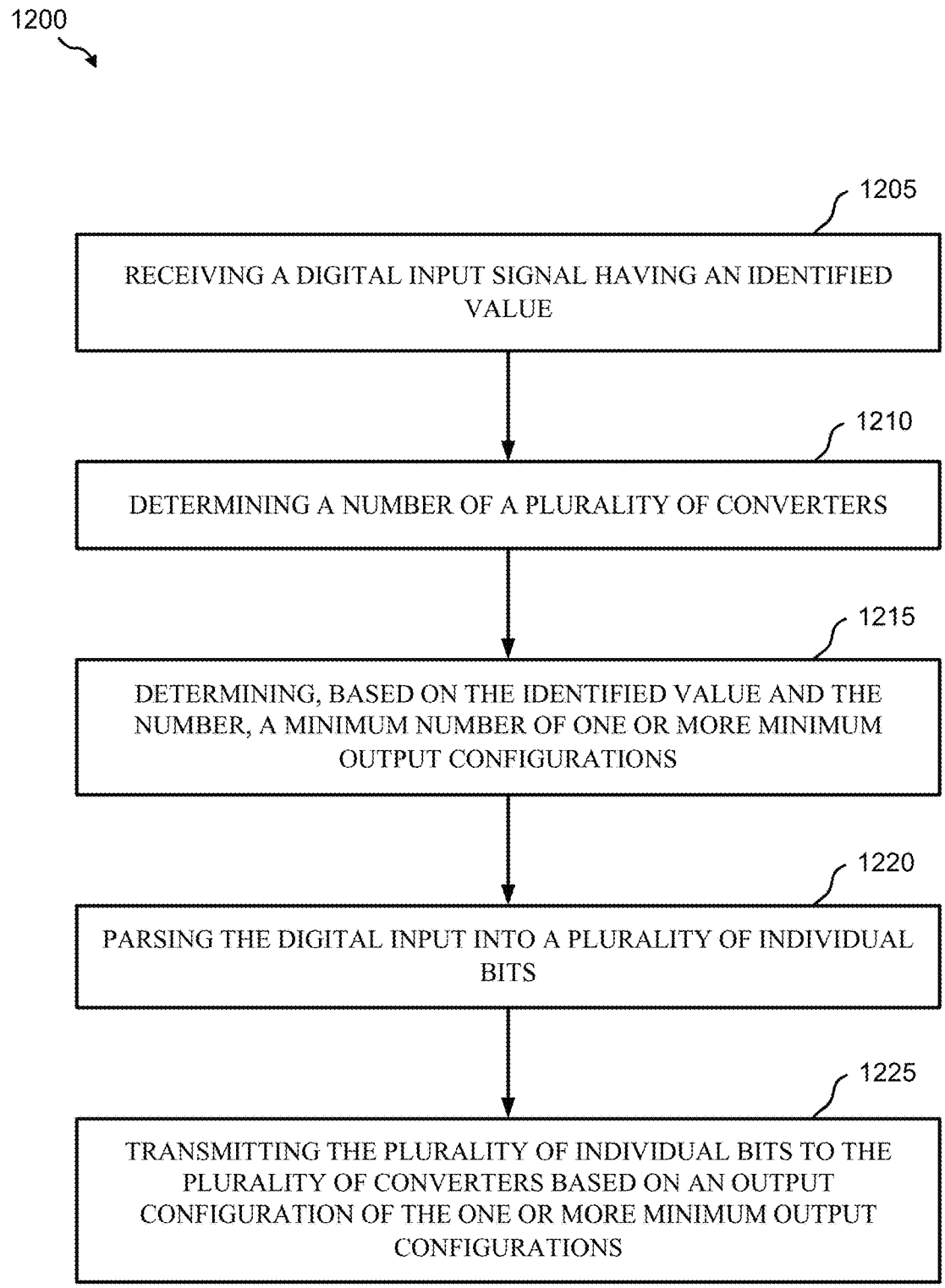
FIG. 12 illustrates an example of a method for performing effort shuffling according to some aspects of the present disclosure.

FIG. 12 illustrates a method 1200 for performing least-effort shuffling according to aspects of the present disclosure. The method 1200 may be performed by one or more of the DAC circuit 100 and/or subcomponents of the DAC circuit 100. The DAC circuit 100 may include one or more of a processor and a memory having instructions stored therein. The processor may be configured to execute the stored instructions to perform aspects of the current disclosure.

At 1205, the method 1200 may receive a digital input signal having an identified value. For example, the shuffler 110 may receive a digital input signal having an identified value. The shuffler 110 may be configured to, and/or provide means for, receiving a digital input signal having an identified value.

At 1210, the method 1200 may determine a number of a plurality of converters. For example, the shuffler 110 may determine a number of a plurality of converters. The shuffler 110 may be configured to, and/or provide means for, determining a number of a plurality of converters.

At 1215, the method 1200 may determine, based on the identified value and the number, a minimum number of one or more minimum output configurations. For example, the shuffler 110 may determine, based on the identified value and the number, a minimum number of one or more minimum output configurations. The shuffler 110 may be configured to, and/or provide means for, determining, based on the identified value and the number, a minimum number of one or more minimum output configurations.

At 1220, the method 1200 may parse the digital input into a plurality of individual bits. For example, the shuffler 110 may parse the digital input into a plurality of individual bits. The shuffler 110 may be configured to, and/or provide means for, parsing the digital input into a plurality of individual bits.

At 1225, the method 1200 may transmit the plurality of individual bits to the plurality of converters based on an output configuration of the one or more minimum output configurations. For example, the shuffler 110 may transmit the plurality of individual bits to the plurality of converters based on an output configuration of the one or more minimum output configurations. The shuffler 110 may be configured to, and/or provide means for, transmitting the plurality of individual bits to the plurality of converters based on an output configuration of the one or more minimum output configurations.

Aspects of the present disclosure include receiving a digital input signal having an identified value, determining a number of a plurality of converters, determining, based on the identified value and the number, a minimum number of one or more minimum output configurations, parsing the digital input into a plurality of individual bits, and transmitting the plurality of individual bits to the plurality of converters based on an output configuration of the one or more minimum output configurations.

Aspects of the present disclosure include the method above, further comprises converting the plurality of individual bits to a plurality of analog signals.

Aspects of the present disclosure include any of the methods above, further comprises summing the plurality of analog signals to generate an analog output signal.

Aspects of the present disclosure include any of the methods above, further comprising selecting the output configuration based on the identified value of the digital input signal.

Aspects of the present disclosure include any of the methods above, wherein determining the minimum number comprises selecting the output configuration with lower noise than at least another output configuration.

Aspects of the present disclosure include any of the methods above, wherein determining the minimum number comprises determining the minimum number based on the equation:

$$N_{min}(x[n]) = \frac{1}{\frac{x[n]}{\Delta} + \frac{1}{2}L} LCM\left(L, \frac{x[n]}{\Delta} + \frac{1}{2}L\right),$$

wherein $N_{min}$ is the minimum number, L is the number of the plurality of converters, and x[n] is the identified value.

The above detailed description in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. For example, changes may be made in the function and arrangement of elements discussed without departing from the scope of the disclosure. Also, various examples may omit, substitute, or add various procedures or components as appropriate. For instance, the methods described may be performed in an order different from that described, and various steps may be added, omitted, or combined. Also, features described with respect to some examples may be combined in other examples. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, charges, impedances, electromagnetic waves, magnetic fields or particles, optical fields or particles, computer-executable code or instructions stored on a computer-readable medium, or any combination thereof.

All or a portion of any aspect described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example aspects, the functions described may be implemented in hardware, software, or any combination thereof. If implemented in software, the functions may be stored on or encoded as one or more instructions or code on a computer-readable medium. Computer-readable media includes computer storage media. Storage media may be any available media that may be accessed by a computer. By way of example, and not limitation, such computer-readable media may comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that may be used to store computer executable code in the form of instructions or data structures that may be accessed by a computer.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above may be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that may be accessed by a general purpose or special purpose computer. By way of example, and not limitation, computer-readable media may comprise RAM, ROM, EEPROM, CD-ROM or other optical disk storage, magnetic disk storage or other magnetic storage devices, or any other medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A method of efficient shuffling in a digital-to-analog converter circuit comprising a plurality of single-bit converters having a common nominal gain and a common nominal offset, the method comprising:
   receiving a digital input signal having a value;
   determining a number of the plurality of single-bit converters that, when activated at the digital-to-analog converter circuit, cause an output of the digital-to-analog converter circuit to indicate the value of the digital input signal;
   determining, based on the value of the digital input signal and the number, a minimum set of output configurations for causing the output of the digital-to-analog converter circuit to indicate the value of the digital input signal while maintaining a linear relationship between the value of the digital input signal and the output of the digital-to-analog converter circuit;
   selecting an output configuration from the minimum set of output configurations; and
   transmitting the selected output configuration to the plurality of converters.

2. The method of claim 1, further comprising using the selected output configuration of the plurality of single-bit converters to generate a plurality of analog signals.

3. The method of claim 2, further comprising summing the plurality of analog signals to generate an analog output signal.

4. The method of claim 1, further comprising selecting the output configuration based on the value of the digital input signal.

5. The method of claim 4, wherein determining the minimum set comprises selecting the output configuration with lower noise than at least another output configuration.

6. The method of claim 1, wherein determining the minimum set comprises determining the minimum set based on the equation:

$$N_{min}(x[n]) = \frac{1}{\frac{x[n]}{\Delta} + \frac{1}{2}L} LCM\left(L, \frac{x[n]}{\Delta} + \frac{1}{2}L\right),$$

wherein $N_{min}$ is the minimum set, L is the number of the plurality of converters, and x[n] is the value of the digital input signal.

7. A controller of a digital-to-analog converter (DAC) circuit, comprising:
   a memory having instructions; and
   a processor configured to execute the instructions to:
      receive a digital input signal having a value;
      determine a number of a plurality of single-bit converters of the DAC that, when activated at the digital-to-analog converter circuit, cause an output of the digital-to-analog converter circuit to indicate the value of the digital input signal;
      determine, based on the value of the digital input signal and the number, a minimum set of output configurations for causing the output of the digital-to-analog converter circuit to indicate the value of the digital input signal;
selecting an output configuration from the minimum set of output configurations; and
transmit the selected output configuration to the plurality of single-bit converters.

8. The controller of claim 7, wherein the processor is further configured to use the selected output configuration of the plurality of single-bit converters to generate a plurality of analog signals.

9. The controller of claim 8, wherein the processor is further configured to sum the plurality of analog signals to generate an analog output signal.

10. The controller of claim 7, wherein the processor is further configured to select the output configuration based on the value of the digital input signal.

11. The controller of claim 10, wherein determining the minimum set comprises selecting the output configuration with lower noise than at least another output configuration.

12. The controller of claim 7, wherein determining the minimum set comprises determining the minimum set number based on the equation:

$$N_{min}(x[n]) = \frac{1}{\frac{x[n]}{\Delta} + \frac{1}{2}L} LCM\left(L, \frac{x[n]}{\Delta} + \frac{1}{2}L\right)$$

wherein $N_{min}$ is the minimum set, L is the number of the plurality of converters, and x[n] is the value of the digital input signal.

13. A digital-to-analog converter (DAC) circuit, comprising:
a controller configured to:
receive a digital input signal having a value;
determine a number of a plurality of single-bit converters of the DAC that, when activated at the digital-to-analog converter circuit, cause an output of the digital-to-analog converter circuit to indicate the value of the digital input signal;
determine, based on the value of the digital input signal and the number, a minimum set of output configurations for causing the output of the digital-to-analog converter circuit to indicate the value of the digital input signal;
selecting an output configuration from the minimum set of output configurations; and
transmit the selected output configuration to the plurality of single-bit converters.

14. The DAC circuit of claim 13, further comprising the plurality of single-bit converters configured to operate in the selected output configuration to generate to a plurality of analog signals.

15. The DAC circuit of claim 14, further comprising an adder configured to sum the plurality of analog signals to generate an analog output signal.

16. The DAC circuit of claim 13, wherein the controller is further configured to select the output configuration based on the value of the digital input signal.

17. The DAC circuit of claim 16, wherein determining the minimum set comprises selecting the output configuration with lower noise than at least another output configuration.

18. The DAC circuit of claim 13, wherein determining the minimum set comprises determining the minimum set number based on the equation:

$$N_{min}(x[n]) = \frac{1}{\frac{x[n]}{\Delta} + \frac{1}{2}L} LCM\left(L, \frac{x[n]}{\Delta} + \frac{1}{2}L\right)$$

wherein $N_{min}$ is the minimum set number, L is the number of the plurality of converters, and x[n] is the value of the digital input signal.

* * * * *